(12) United States Patent
Kim et al.

(10) Patent No.: US 7,902,553 B2
(45) Date of Patent: Mar. 8, 2011

(54) THIN FILM TRANSISTOR ARRAY PANEL AND METHOD FOR MANUFACTURING THE SAME

(75) Inventors: Byoung-June Kim, Seoul (KR); Jae-Ho Choi, Seoul (KR); Chang-Oh Jeong, Suwon-si (KR); Sung-Hoon Yang, Seoul (KR); Je-Hun Lee, Seoul (KR); Do-Hyun Kim, Seoul (KR); Hwa-Yeul Oh, Suwon-si (KR); Yong-Mo Choi, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 652 days.

(21) Appl. No.: 11/930,536

(22) Filed: Oct. 31, 2007

(65) Prior Publication Data
US 2008/0185590 A1    Aug. 7, 2008

(30) Foreign Application Priority Data
Feb. 7, 2007   (KR) .................... 10-2007-0012634

(51) Int. Cl.
*H01L 29/04* (2006.01)

(52) U.S. Cl. .............. 257/72; 257/529; 257/E29.117; 349/42; 349/43; 349/139; 349/147

(58) Field of Classification Search .......... 257/E29.117, 257/59, 72; 349/42–43, 139, 147
See application file for complete search history.

(56) References Cited

U.S. PATENT DOCUMENTS

| 6,355,943 B1 * | 3/2002 | Sung ............................... 257/72 |
| 6,731,364 B2 * | 5/2004 | Takahashi et al. ............ 349/139 |
| 7,247,911 B2 * | 7/2007 | Tsai et al. ...................... 257/347 |

* cited by examiner

*Primary Examiner* — Cuong Q Nguyen
*Assistant Examiner* — Trang Q Tran
(74) *Attorney, Agent, or Firm* — F. Chau & Associates, LLC

(57) ABSTRACT

A manufacturing method of a thin film transistor (TFT) includes forming a gate electrode including a metal that can be combined with silicon to form silicide on a substrate and forming a gate insulation layer by supplying a gas which includes silicon to the gate electrode at a temperature below about 280° C. The method further includes forming a semiconductor on the gate insulation layer, forming a data line and a drain electrode on the semiconductor and forming a pixel electrode connected to the drain electrode.

11 Claims, 21 Drawing Sheets

THIN FILM TRANSISTOR ARRAY PANEL AND METHOD FOR MANUFACTURING THE SAME

CROSS-REFERENCE TO RELATED APPLICATION

This application claims priority to Korean Patent Application No. 10-2007-0012634 filed on Feb. 7, 2007, the disclosure of which is hereby incorporated herein by reference herein in its entirety.

BACKGROUND OF THE INVENTION (a) Technical Field

The present disclosure relates to a thin film transistor array panel and a manufacturing method thereof.

(b) Description of the Related Art

In general, flat panel displays, such as liquid crystal displays (LCDs), organic light emitting diode (OLED) displays, and the like, include a plurality of pairs of field generating electrodes and an electro-optical active layer interposed therebetween. LCDs include a liquid crystal layer as the electro-optical active layer, whereas the OLED displays include an organic emission layer as the electro-optical active layer.

One of the pair of the field generating electrodes is typically connected to a switching element to receive an electrical signal, and the electro-optical active layer converts the electrical signal into an optical signal for displaying an image.

Flat panel displays use thin film transistors (TFTs), which are three-terminal elements as the switching elements, gate lines for transmitting scan signals that control the TFTs, and data lines for transmitting signals through the TFTs to pixel electrodes formed on the display.

As the area of a display device increases, the number of signal lines may be increased, and accordingly resistance thereof may also be increased. The increase of resistance may in turn cause a signal delay or a voltage drop, and therefore the signal lines may need to be made of a material having low resistivity, such as for example copper (Cu).

However, when the signal line is made of copper, silane (SiH4) gas may react with the surface of a copper (Cu) line during a process of forming an insulating layer on the copper line, and accordingly copper-silicide (Cu-silicide) is formed, thereby causing the copper layer to be contaminated. At a high temperature, the copper-silicide (Cu-silicide) becomes unstable and thus repeats decomposition and composition, and accordingly the thickness of the copper-silicide (Cu-silicide) increases because silicon (Si) decomposed from the copper-silicide (Cu-silicide) is continuously diffused, thereby increasing the resistance of the copper line.

Therefore, when copper is used as the signal line, a capping layer made of a refractory metal such as, for example, molybdenum or an alloy thereof is formed to cover the copper line so as to prevent the copper line from reacting with silicon (Si).

However, when the capping layer is further formed on the upper portion of the copper line, while unique characteristics of low resistivity wiring can be maintained, manufacturing time may be increased for forming a multi-layer.

SUMMARY OF THE INVENTION

Exemplary embodiments of the present invention provide a manufacturing method of a liquid crystal display (LCD) using a copper signal line having the benefits of forming copper-silicide on an upper portion of the copper signal line, thereby preventing resistance of the copper signal line from being increased.

In accordance with an exemplary embodiment of the present invention, a manufacturing method of a thin film transistor (TFT) is provided. The method includes forming a gate electrode including a metal that can be combined with silicon to form silicide on a substrate, forming a gate insulation layer by supplying a gas which includes silicon to the gate electrode at a temperature below about 280° C., forming a semiconductor on the gate insulation layer, forming a data line and a drain electrode on the semiconductor and forming a pixel electrode connected to the drain electrode.

The gate line may comprise copper, and the gate insulating layer may be comprise silicon nitride ($SiN_x$).

The forming of the gate insulation layer may be performed at a temperature of about 220° C. to about 280° C., and when forming the gate insulation layer, the temperature of the substrate may be about 220° C. to about 250° C.

The manufacturing method may further include forming a passivation layer by supplying a gas which includes silicon at a temperature of less than or equal to about 280° C. after forming the data line and the drain electrode.

In accordance with an exemplary embodiment of the present invention, a manufacturing method is provided. The method includes: forming a gate electrode including a metal that can be combined with silicon to form silicide, forming a first silicon nitride layer on the gate electrode by supplying a gas which includes silicon and a gas which includes nitrogen and forming a second silicon nitride layer by supplying a gas which includes silicon and a gas which includes nitrogen on the first silicon nitride layer, wherein a flow amount ratio of the two gases is different from a flow amount ratio supplied for forming the first silicon nitride layer. The method further includes forming a semiconductor on the second silicon nitride layer, forming a data line and a drain electrode on the semiconductor and forming a pixel electrode connected to the drain electrode. Moreover, a [N—H]/[Si—H] binding number ratio of the second silicon nitride layer may be less than that of the first silicon nitride layer.

The gate line may comprise copper.

The first silicon nitride layer may have a thickness of about 50 to about 600 Å. A [N—H]/[Si—H] binding number ratio of the first silicon nitride layer may be about 40, and a [N—H]/[Si—H] binding number ratio of the second silicon nitride layer may be about 1.5 to about 2.5.

In accordance with an exemplary embodiment of the present invention, a thin film transistor array panel (TFT) is provided. The TFT includes a gate electrode, a semiconductor, a gate insulation layer, source and drain electrodes, and a pixel electrode. The gate electrode includes a metal that can be combined with silicon to form silicide. The semiconductor is formed under or over the gate electrode. The gate insulation layer is formed between the gate electrode and the semiconductor. The source and drain electrodes contact the semiconductor. The pixel electrode is connected to the drain electrode. The gate insulation layer includes a first silicon nitride layer and a second silicon nitride layer interposed between the first silicon nitride layer and the semiconductor, and a [N—H]/[Si—H] binding number ratio of the first silicon nitride layer is greater than that of the second silicon nitride layer.

The [N—H]/[Si—H] binding number ratio of the first silicon nitride layer may be about 20 to about 40, and the [N—H]/[Si—H] binding number ratio of the second silicon nitride layer may be about 1.5 to about 2.5.

The TFT array panel may further include a passivation layer formed on the source electrode and the drain electrode, the passivation layer includes a third silicon nitride layer and a fourth silicon nitride layer interposed between the third silicon nitride layer and the pixel electrode, and a [N—H]/[Si—H] binding number ratio of the third silicon nitride layer may be greater than that of the fourth silicon nitride layer.

In accordance with an exemplary embodiment of the present invention, a thin film transistor array (TFT) panel is provided. The TFT includes a gate electrode, a semiconductor, a gate insulation layer, source and drain electrodes, and a pixel electrode. The gate electrode includes a metal that can be combined with silicon to form silicide. The semiconductor is formed under or over the gate electrode. The gate insulation layer is interposed between the gate electrode and the semiconductor and includes silicon nitride. The source and drain electrodes contact the semiconductor. The pixel electrode is connected to the drain electrode. The gate insulation layer includes a contact unit that contacts the gate electrode, a channel unit that contacts the semiconductor, and a middle unit interposed between the contact unit and the channel unit. Moreover, the contact unit and the middle unit have different [N—H]/[Si—H] binding number ratios.

The [N—H]/[Si—H] binding number ratio of the contact unit may be greater than that of the middle unit, and the [N—H]/[Si—H] binding number ratio of the contact unit may be about 20 to about 40 and the [N—H]/[Si—H] binding number ratio of the middle unit may be about 1.5 to about 2.5.

The [N—H]/[Si—H] binding number ratios of the contact unit and the channel unit may be greater than that of the middle unit, the [N—H]/[Si—H] binding number ratios of the contact unit and the channel unit may be about 20 to about 40, and the [N—H]/[Si—H] binding number ratio of the middle unit may be about 1.5 to about 2.5.

BRIEF DESCRIPTION OF THE DRAWINGS

Exemplary embodiments of the present invention can be understood in more detail from the following description taken in conjunction with the accompanying drawings, in which.

DETAILED DESCRIPTION OF THE EXEMPLARY EMBODIMENTS OF THE INVENTION

Figure 1:
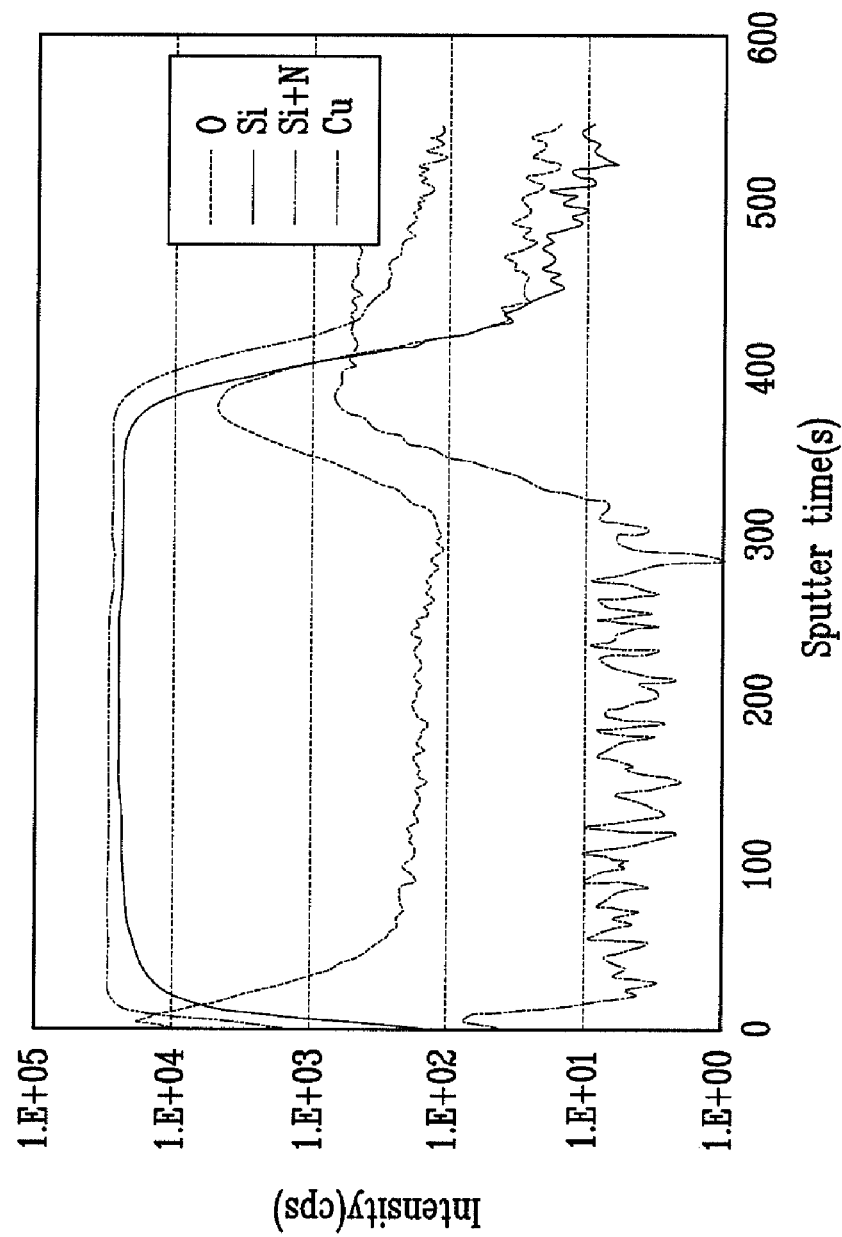
FIG. 1 and FIG. 2 are graphs showing component analysis results of a silicon nitride ($SiN_x$) layer deposited on a copper line at about 250° C. and at about 320° C., respectively.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary Embodiment 1

In a process of forming an insulation layer including silicon in an upper portion of a copper line, a method for controlling resistance of the copper line by controlling a chemical vapor deposition (CVD) temperature will be described in further detail.

Table 1 and Table 2 respectively show Gibbs free energy that occurs when copper oxide (CuO or $Cu_2O$) and silane ($SiH_4$) react with each other and thus they are decomposed into copper (Cu) and silicon (Si). Herein, the copper is quickly oxidized when it is exposed to air so that it forms copper oxide, and therefore pure copper hardly meets a silane ($SiH_4$) gas.

TABLE 1

| Absolute temperature K | $CuO + SiH_4$ | $CuSi - H_2O + H_2$ | $CuO + SiH_4 = Cu + Si + H_2O - H_2$ |
|---|---|---|---|
| 298.15 | −295.474 | −352.625 | −157.151 |
| 300 | −295.932 | −353.313 | −157.381 |
| 400 | −222.054 | −392.274 | −170.12 |
| 500 | −256.66 | −433.834 | −183.174 |
| 600 | −281.431 | −477.781 | −196.35 |
| 700 | −314.152 | −523.673 | −209.521 |
| 800 | −348.647 | −571.266 | −222.629 |
| 900 | −384.77 | −620.378 | −235.608 |

TABLE 2

| Absolute temperature K | $Cu_2O + SiH_4$ | $2Cu + Si - H_2O + H_2$ | $Cu_2O + SiH_4 = 2Cu + Si + H_2O + H_2$ |
|---|---|---|---|
| 298.15 | −221.95 | −362.513 | −140.563 |
| 300 | −225.501 | −363.262 | −137.761 |
| 400 | −253.927 | −405.828 | −148.901 |
| 500 | −291.346 | −451.832 | −160.486 |
| 600 | −328.375 | −500.643 | −172.268 |
| 700 | −367.731 | −551.843 | −184.112 |
| 800 | −409.196 | −605.131 | −195.935 |
| 900 | −452.583 | −660.283 | −207.68 |

As shown in Table 1 and Table 2, the Gibbs free energy that occurs when the copper oxide CuO and $Cu_2O$ and the silane $SiH_4$ react with each other and they are decomposed into copper Cu and silicon Si has a negative value, and this implies that a reaction voluntarily occurs. As the temperature increases, the Gibbs free energy has a larger negative value, and therefore the copper oxide and the silane react better at a higher temperature. However, when the copper oxides CuO and $Cu_2O$, and the silane $SiH_4$ are reacted and decomposed into Cu and Si, Si and Cu are bonded, thereby forming copper-silicide.

Therefore, when the insulation layer including silicon is deposited on the copper line at a relatively low temperature, the copper oxide CuO and silane $SiH_4$ reaction and decomposition into Cu and Si can be suppressed, thereby preventing copper-silicide from being formed, and accordingly the resistance increase of the copper line can be prevented.

Figure 2:
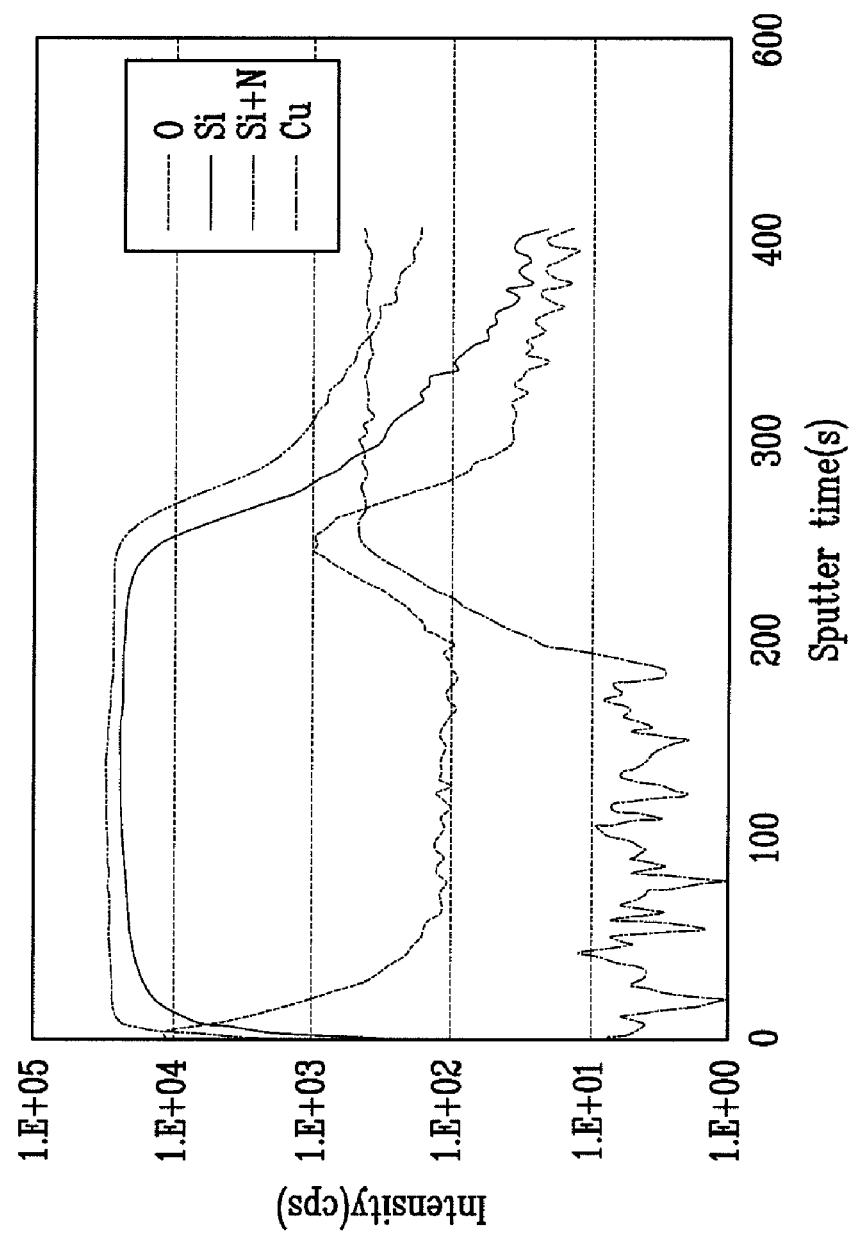

When a silicon nitride ($SiN_x$) layer is formed on a glass substrate having a copper line with a variation of temperature in a chamber, composition of the silicon nitride layer and the copper line are varied as shown in FIG. 1 and FIG. 2.

FIG. 1 and FIG. 2 are graphs respectively showing composition analysis results for a silicon nitride ($SiN_x$) layer deposited on the copper line at about 250° C. and at about 320° C. by using secondary ion mass spectrometry (SIMS).

The about 250° C. and about 320° C. respective represent glass substrate temperatures.

In the graphs of FIG. 1 and FIG. 2, the vertical axis denotes a time during which a sputtering process is performed to the substrate as a target on which the silicon nitride layer and the copper line are formed. That is, when the substrate is used as the target for the sputtering process, components positioned on a surface of the silicon nitride layer are removed by plasma at an initial stage of the sputtering process, and components positioned deeper from the surface of the silicon nitride layer are removed as a sputter time lapses. Therefore, in FIG. 1 and FIG. 2, the depth from the insulating layer surface and time are proportional to each other, and the sputtering time increases as the depth from the insulating layer surface increases.

In addition, in FIG. 1 and FIG. 2, curved lines are suddenly changed at an interface portion of the silicon nitride insulating layer and the copper line.

As shown in FIG. 1 and FIG. 2, when the silicon nitride layer is deposited at about 250° C., the amount of silicon (Si) is more significantly decreased from the $Cu/SiN_x$ interface than when the substrate is deposited at about 320° C. When the silicon nitride is deposited at about 250° C., silicon is not deeply diffused into the copper line, and in this case, a change of formation of copper-silicide is reduced, thereby preventing the resistance of the copper line from being increased.

In the first exemplary embodiment, the temperature of the glass substrate is about 250° C., but the processing temperature of a chamber may be about 250° C. to about 280° C.

In addition, as described above, the copper oxide and the silane react better at a higher temperature, and therefore when the glass substrate temperature is less than about 250° C., that is, when the processing temperature of the chamber is less than about 280° C., the diffusion of the silicon can be more reduced, thereby more decreasing the resistance of the copper line. In this case, the temperature of the glass substrate is preferably about 220° C. to about 250° C., and the chamber temperature is preferably about 220° C. to about 280° C.

However, the quality of the layer may be deteriorated and processing time may be increased when the temperature for deposition of the silicon nitride layer is decreased, and therefore the deposition temperature cannot be limitlessly decreased.

That is, when the temperature is too low, the quality of the deposited insulating layer is deteriorated so that it cannot act as either a dielectric layer or a passivation layer. Therefore, it is important to decrease the temperature while preventing the layer quality from being deteriorated.

The following table 3 shows a comparison of a resistance of gate wiring and characteristics of a thin film transistor in which a gate insulation layer is deposited at about 250° C. on gate wiring that is made of copper and in which a thin film transistor (TFT) is formed after the gate insulation layer is deposited on the gate wiring made of copper at about 320° C.

TABLE 3

| CVD deposition conditions | Glass No. | Cu line resistance $\Omega\eta$ | Resistance $\Omega\eta$ after forming insulation layer | Resistance $\Omega\eta$ after annealing | On-current A | Off-current A | On/Off ratio |
|---|---|---|---|---|---|---|---|
| 320° C. | 1 | 2.35 | 3.13 | 3.13 | 7.09E−06 | 4.36E−13 | 1.63E+07 |
| 320° C. | 2 | 2.35 | 2.78 | 2.82 | 7.37E−06 | 5.84E−13 | 1.26E+07 |
| 320° C. | 3 | 2.37 | 2.75 | 3.10 | 7.77E−06 | 6.29E−13 | 1.24E+07 |
| 320° C. | 4 | 2.34 | 2.89 | 3.11 | 7.83E−06 | 6.65E−13 | 1.18E+07 |
| 320° C. | 5 | 2.37 | 3.10 | 3.12 | 7.69E−06 | 6.43E−13 | 1.20E+07 |
| 320° C. | 6 | 2.34 | 2.92 | 3.11 | 7.50E−06 | 9.22E−13 | 8.13E+07 |
| 250° C. | 1 | 2.38 | 2.19 | 2.18 | 3.87E−06 | 2.30E−13 | 1.68E+07 |
| 250° C. | 2 | 2.27 | 2.11 | 2.09 | 4.03E−06 | 2.83E−13 | 1.42E+07 |
| 250° C. | 3 | 2.41 | 2.21 | 2.20 | 3.88E−06 | 2.99E−13 | 1.30E+07 |
| 250° C. | 4 | 2.33 | 2.15 | 2.13 | 4.11E−06 | 3.03E−13 | 1.36E+07 |
| 250° C. | 5 | 2.42 | 2.22 | 2.21 | 3.90E−06 | 3.73E−13 | 1.05E+07 |
| 250° C. | 6 | 2.40 | 2.23 | 2.21 | 3.99E−06 | 4.61E−13 | 8.66E+07 |

As shown in Table 3, after a copper line is formed, resistance values of the copper line at an early stage are similar to each other within a range between about 2.279 $\Omega$m to about 2.42 $\Omega$m. When the CVD temperature is about 320° C., the resistance values are between about 2.82 $\Omega$m to about 3.13 $\Omega$m after a transistor is formed, and when the CVD temperature is about 250° C., the resistance values are between about 2.09 $\Omega$m to about 2.21 $\Omega$m after the transistor is formed. That is, the deposition conditions may significantly affect the resistance values of the copper line.

When the CVD temperature is about 250° C., an on-current of the transistor is reduced to 4E-06A from a range of about 7E-06A to about 8E-06A compared to when the CVD temperature is about 320° C. However, the transistor can be sufficiently driven when the on-off ratio is greater than only about 1E+06. As shown in Table 3, as the on-off ratio is about 8E+06 to about 1.5E+07 at about 250° C., the transistor can be sufficiently driven.

Therefore, when the gate insulation layer is deposited at about 250° C., the resistance of the gate wiring can be reduced without causing damage when driving the transistor.

A thin film transistor (TFT) array panel according to an exemplary embodiment of the present invention will be described in further detail with reference to FIG. 3 to FIG. 5.

Figure 3:
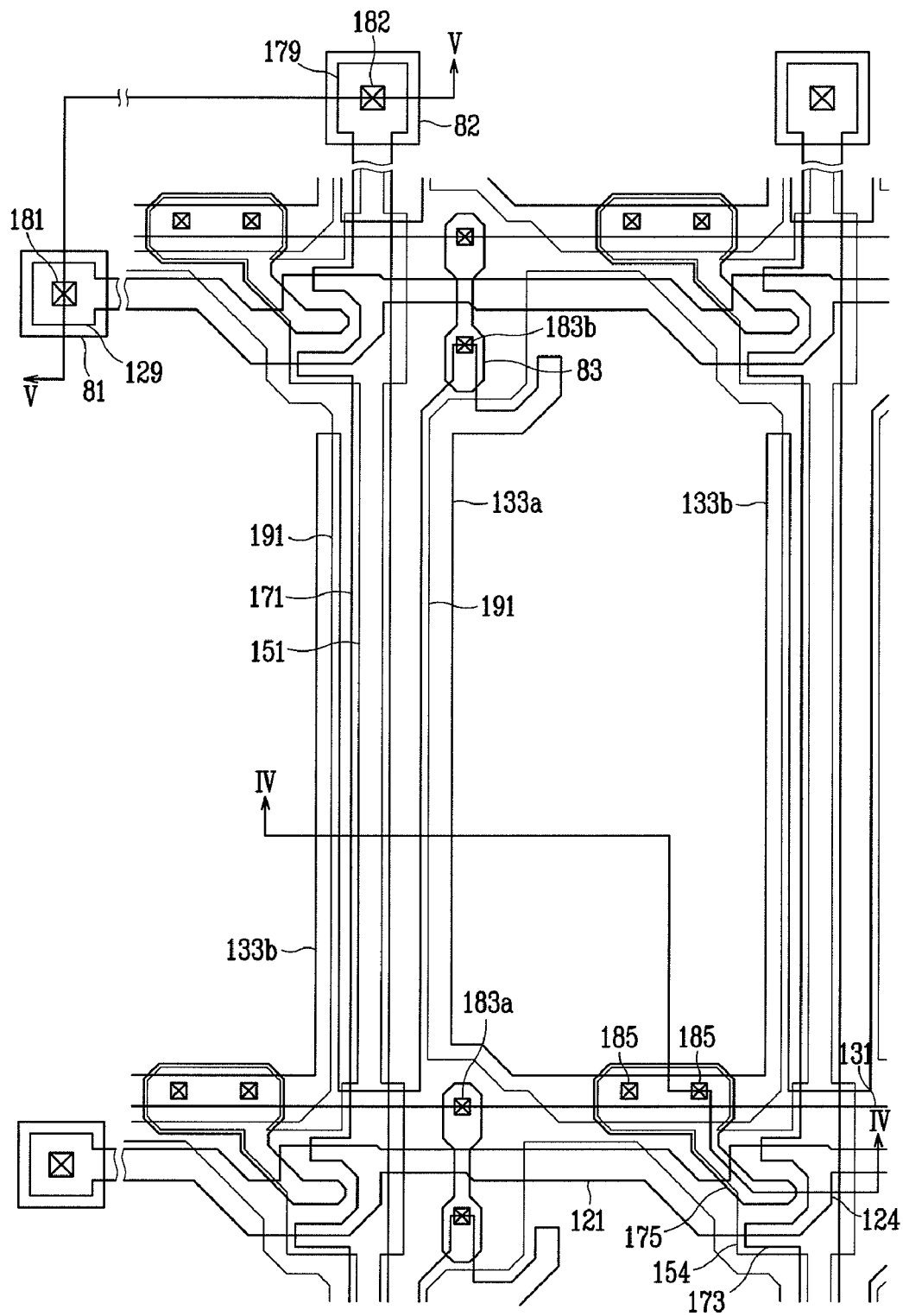
FIG. 3 is a layout view of a thin film transistor (TFT) array panel according to an exemplary embodiment of the present invention.
Figure 4:
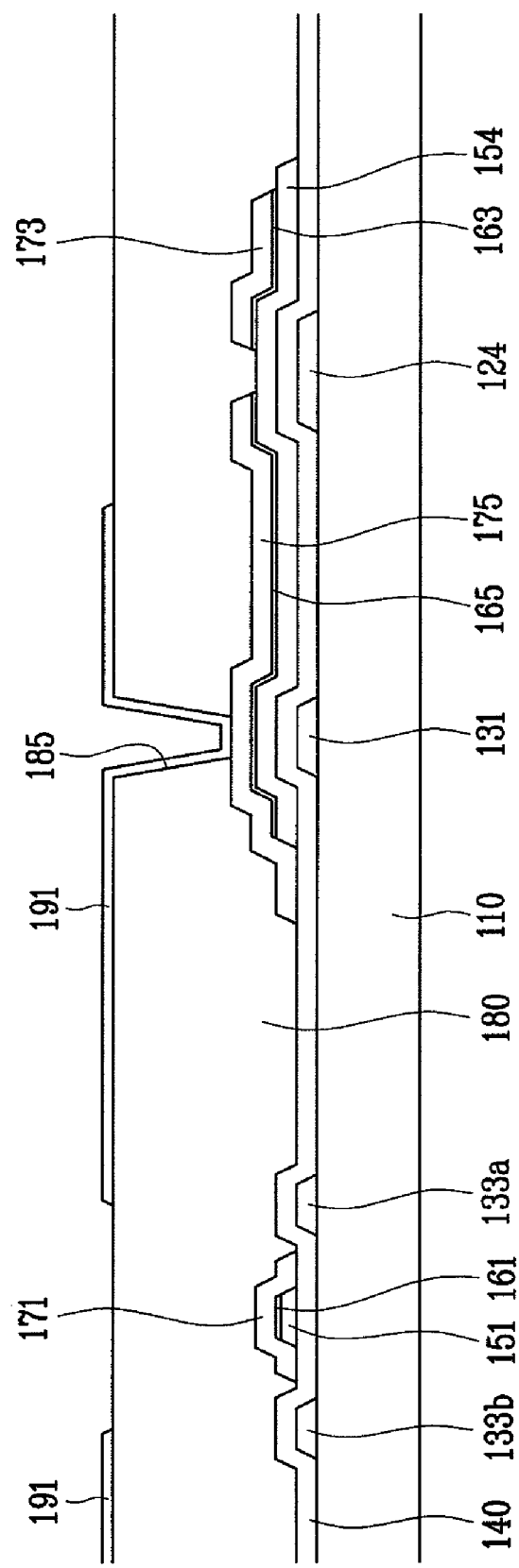
FIG. 4 and FIG. 5 are cross-sectional views of the TFT array panel of FIG. 3, taken along lines IV-IV and V-V.
Figure 5:
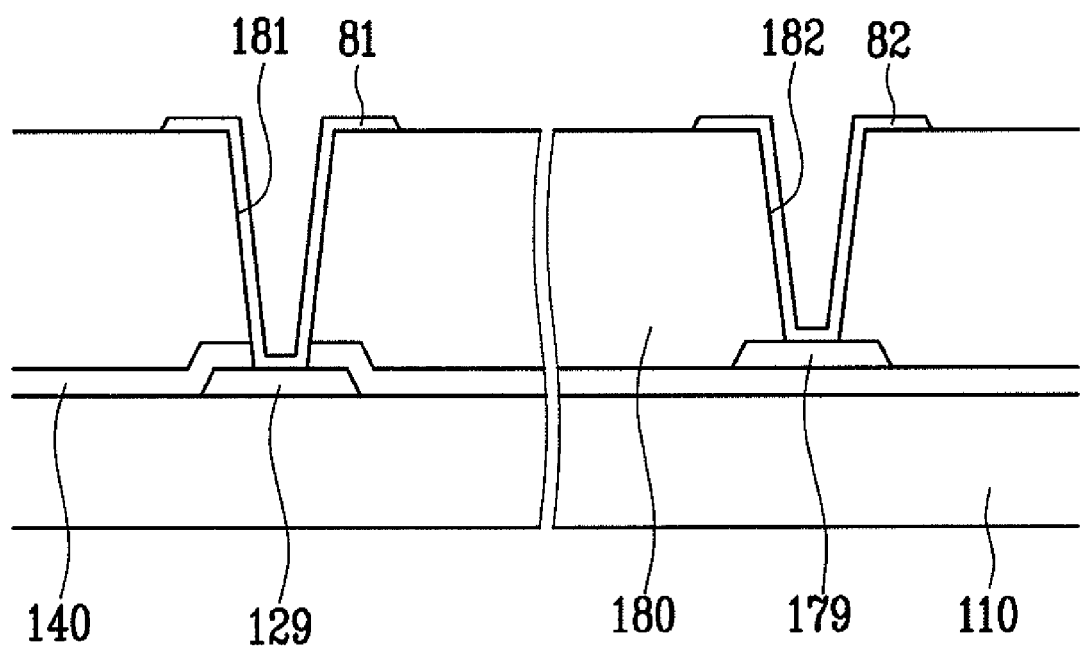

FIG. 3 is a layout view of a TFT array panel according to an exemplary embodiment of the present invention, and FIG. 4 and FIG. 5 are cross-sectional views of the TFT array panel of FIG. 3, taken lines IV-IV and V-V, respectively.

A plurality of gate lines 121 and a plurality of storage electrode lines 131 are formed on an insulation substrate 110 made of transparent glass or plastic.

The gate lines 121 transmit gate signals, and mainly extend in a horizontal direction. Each gate line 121 includes a plurality of gate electrodes 124 that protrude downward and a wide end portion 129 for connection to another layer or an external driving circuit. A gate driving circuit for generating gate signals may be mounted on a flexible printed circuit film that is attached to the substrate 110, that may be directly mounted on the substrate 110, or that may be integrated with the substrate 110. When the gate driving circuit is integrated with the substrate 110, the gate lines 121 may be extended to be directly connected thereto.

The storage electrode lines 131 receive a predetermined voltage, and have stem lines extending almost parallel to the gate lines 121 and a plurality of pairs of first and second storage electrodes 133a and 133b that branch off from the stem lines. Each storage electrode line 131 is disposed between two adjacent gate lines 121, and a stem line of the storage electrode 131 is placed closer to the upper one of the two adjacent gate lines 121. The storage electrodes 133a and 133b respectively include a fixed end connected to the stem line 132 and a free end opposite to the fixed end. The fixed end of the first storage electrode 133a has a wide area, and the free end is divided into a straight part and a bent part. However, the shape and arrangement of the storage electrode lines 121 can be variously changed.

The gate lines 121 and the storage electrode lines 131 can be made of, for example, a copper-based metal such as copper or a copper alloy. However, they may have, for example, a double-layer structure including two layers with physical properties that are different from each other. For example, the upper layer of the two layers may be made of a copper-based metal having low resistivity for reducing a signal delay or a voltage drop, and the lower layer is made of a molybdenum-based metal, chromium, tantalum, or titanium.

The lateral sides of the gate lines 121 and the storage electrode lines are inclined toward the surface of the substrate 110 at an inclination angle of about 30 degrees to about 80 degrees.

A gate insulating layer 140 made of silicon nitride ($SiN_x$) is formed on the gate lines 121 and the storage electrode lines 131.

On the gate insulating layer 140, a plurality of semiconductors 151 made of hydrogenated amorphous silicon (abbreviated as hydrogenated a-Si) or polysilicon are formed. The semiconductors 151 are mainly extend to a vertical direction, and include a plurality of projections 154 protruding toward the gate electrodes 124. The width of each semiconductor 151 extends at a region close to the gate line 121 and the storage electrode line 131, thereby widely covering the gate line 121 and the storage electrode line 131.

A plurality of ohmic contact stripes and islands 161 and 165 are formed on the semiconductors 151. The ohmic contacts 161 and 165 may be made of a material such as, for example, n+ hydrogenated a-Si in which an n-type impurity such as phosphor is highly doped, or silicide. The ohmic contact stripes 161 include a plurality of projections 163, and the projections 163 and the ohmic contact islands 165 are disposed in pairs on the projections 154 of the semiconductors 151.

The lateral sides of the semiconductors 151 and the ohmic contacts 161 and 165 are also inclined with respect to a surface of the substrate 110, and an inclined angle thereof preferably ranges from about 30 degrees to about 80 degrees.

On the ohmic contacts 161 and 165 and the gate insulating layer 140, a plurality of data lines 171 and a plurality of drain electrodes 175 are formed.

The data lines 171 transmit data signals, and mainly extend in a vertical direction and cross the gate lines 121. Each of data line 171 crosses the storage electrode lines 131 and runs betweens a set of adjacent storage electrodes 133a and 133b. Each data line 171 includes a plurality of source electrodes 173 extending toward the gate electrode 124 to be bent in a "J" shape towards the gate electrode 124. The data lines 171 also include an end portion 179 having a wide area for connection to another layer or an external driving circuit. A data driving circuit for generating data signals may be mounted on a flexible printed circuit film that is attached to the substrate 110, it may be directly mounted on the substrate 110, or it may be integrated with the substrate 110. When the data driving circuit is integrated with the substrate 110, the data lines 171 may be extended to be directly connected thereto.

The drain electrodes 175 are separated from the data lines 171 and face the source electrodes 173 with the gate electrodes 124 interposed therebetween. Each of drain electrode 175 has one wide end portion and another rod-shaped end portion. The wide end portion overlaps the storage electrode line 131, and the rod-shaped end portion is partially surrounded by the source electrode 173.

A gate electrode 124, a source electrode 173, and a drain electrode 175 form a thin film transistor (TFT) with the projection 154 of the semiconductor 151, and the channel of the TFT is formed in the projection 154 between the source electrode 173 and the drain electrode 175.

The data lines 171 and the drain electrodes 175 may be made of, for example, a copper-based metal such as copper (Cu) or a Cu alloy. However, they may have, for example, a double-layer structure including two layers with physical properties that are different from each other. For example, the upper layer of the two layers may be made of a copper-based metal having low resistivity for reducing a signal delay or a voltage drop, and the lower layer is made of a molybdenum-based metal, chromium, tantalum, or titanium.

The lateral sides of the data lines 171 and drain electrodes 175 are also inclined toward the surface of the substrate 110 at an inclination angle of about 30 degrees to about 80 degrees.

The ohmic contacts 161 and 165 exist only between the semiconductors 151, the data lines 171, and the drain electrodes 175 to reduce the resistance between them. Although the semiconductor 151 is narrower than the data line 171 for the most part, as described above, the semiconductor 151 becomes wider at a portion where it meets the gate line 121, so that the surface profile becomes smooth to thereby prevent the data line 171 from being cut. Semiconductors 151 have portions that are exposed without being covered by the data lines 171 and the drain electrodes 175.

A passivation layer 180 is formed on the data lines 171, the drain electrodes 175, and the exposed portions of the semiconductors 151. The passivation layer 180 may be made of an inorganic insulator such as, for example, silicon nitride, and its surface may be substantially flat. A plurality of contact holes 182 and 185 respectively exposing the end portions 179 of the data lines 171 and the drain electrodes 175 are formed in the passivation layer. A plurality of contact holes 181 exposing the end portion 129 of the gate line and a plurality of contact holes 183a exposing a portion of the storage electrode line 131 near the fixed end of the first storage electrode 133a, and a plurality of contact holes 183b exposing projections of the free end of the first storage electrode 133a are formed on the passivation layer 180 and the gate insulating layer 140.

A plurality of pixel electrodes 191, a plurality of overpasses 83, and a plurality of contact assistants 81 and 82 are formed on the passivation layer 180. These members may be made of a transparent conductive material such as, for example, indium-tin-oxide (ITO) or indium zinc oxide (IZO), or a reflective metal such as, for example, aluminum, silver, chromium, or alloys thereof.

Each of pixel electrode 191 is physically and electrically connected to a drain electrode 175 through a contact hole 185, and a data voltage is applied to the pixel electrode 191 from the drain electrode 175. The pixel electrodes 191 are applied with the data voltage to generate an electrical field together with a common electrode of the other display panel to which a common voltage is applied, and thereby determine an orientation of liquid crystal molecules of a liquid crystal layer between the two electrodes. The polarization of light passing the liquid crystal layer changes according to the orientation of the liquid crystal molecules determined as such. A pixel electrode 191 and the common electrode form a capacitor (hereinafter referred to as a liquid crystal capacitor) to thereby maintain the applied voltage even after the TFT is turned off.

A pixel electrode 191 and a drain electrode 175 connected thereto overlap the storage electrodes 133a and 133b and a storage electrode line 131. A pixel electrode 191 and a drain electrode 175 electrically connected thereto overlap a storage electrode line 131 to thereby form a capacitor, and this capacitor is referred to as a storage capacitor. The storage capacitor strengthens the voltage-maintaining capacity of the liquid crystal capacitor.

Each of overpass 83 crosses a gate line 121, and is connected to the exposed portion of a storage line 131 and the exposed end portion of the free end of a storage electrode 133b through the contact holes 183a and 183b that are disposed to be opposite to each other with the gate line 121 interposed therebetween. The storage electrodes 133a and 133b and the storage electrode lines 131 can be used to fix defects of the gate lines 121, the data lines 171, or the TFT together with the overpasses 83.

The contact assistants 81 and 82 are connected to the end portion 129 of the gate line 121 and the end portion 179 of the data line 171 through the contact holes 181 and 182, respectively. The contact assistants 81 and 82 supplement connection of the end portions 129 of the gate lines 121 and the end portions 179 of the data lines 171 to external devices, and protect them.

A manufacturing method of the TFT of FIG. 3 to FIG. 5 will be described in further detail with reference to FIG. 6 to FIG. 20.

Figure 6:
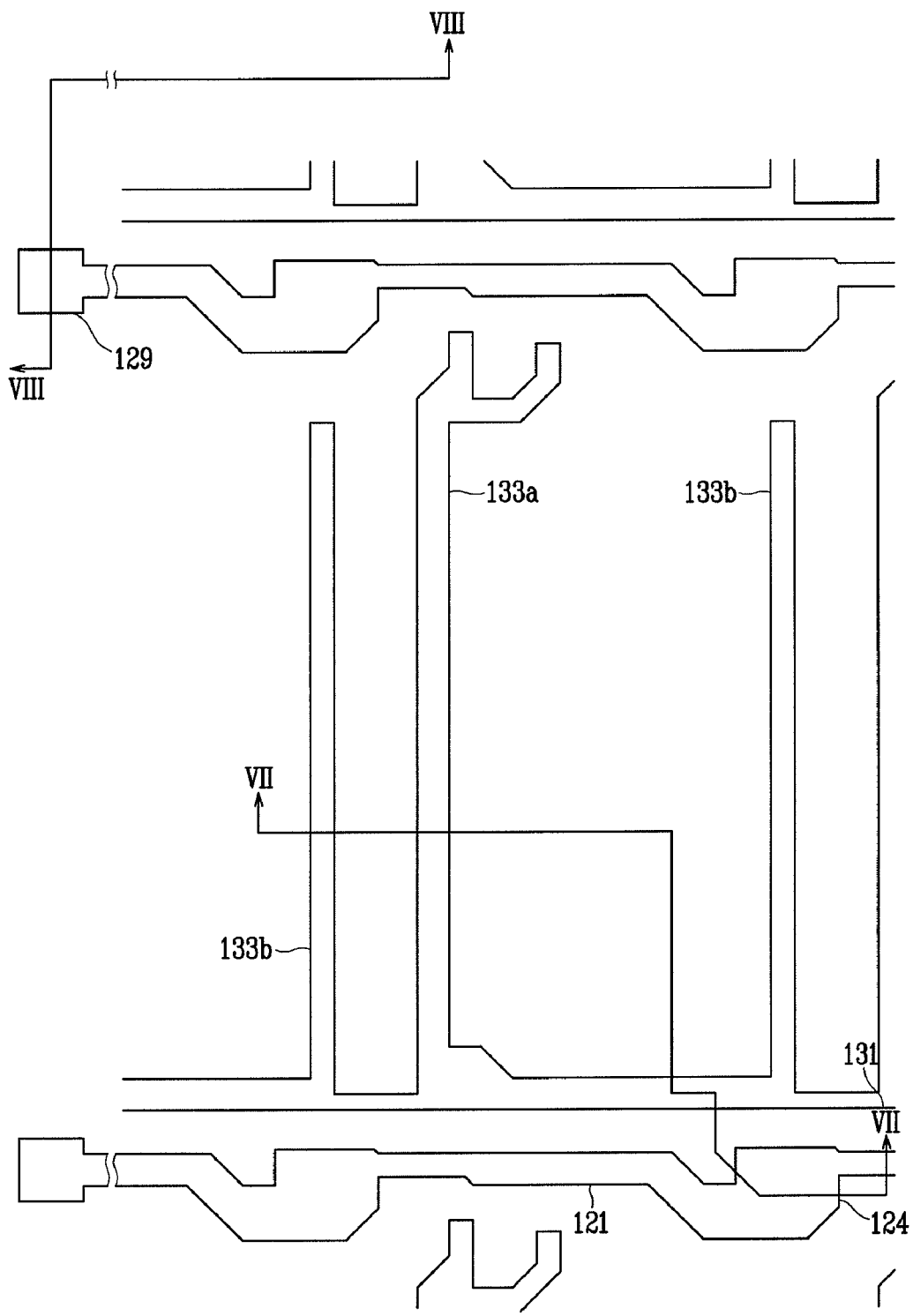
FIG. 6, FIG. 11, FIG. 14, and FIG. 17 are cross-sectional views sequentially illustrating a manufacturing process of the TFT array panel according to an exemplary embodiment of the present invention.
Figure 7:
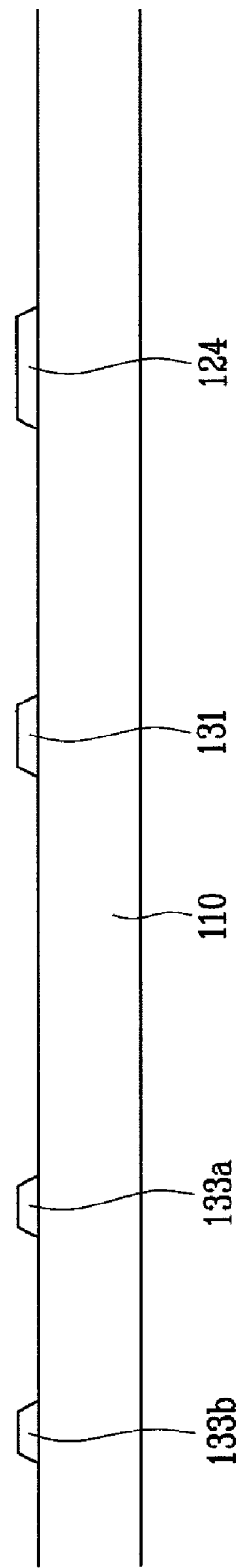
FIG. 7 and FIG. 8 are cross-sectional views of the TFT of FIG. 6, taken along lines VII-VII and VIII-VIII, respectively.
Figure 8:
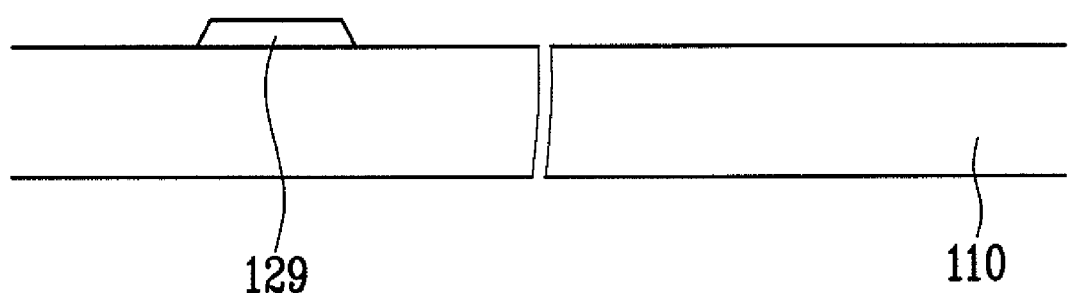
Figure 9:
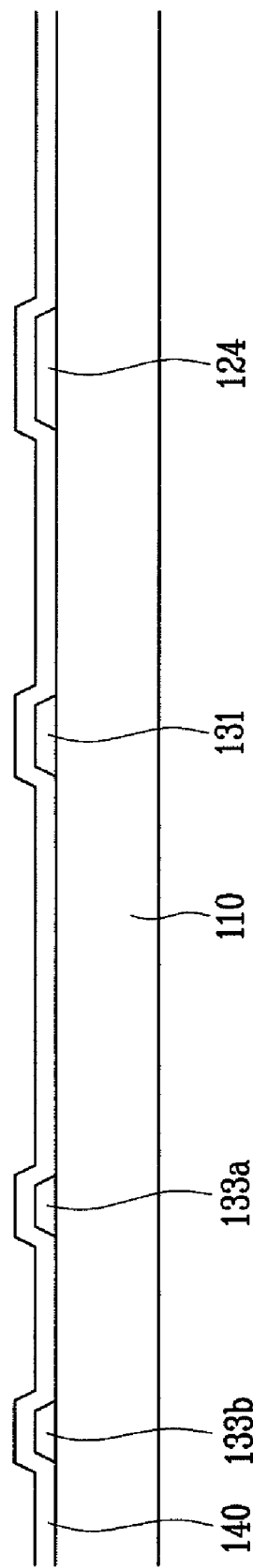
FIG. 9 and FIG. 10 are cross-sectional views respectively illustrating the TFT array panel of FIG. 7 and FIG. 8 in the next stage of the manufacturing process.
Figure 10:
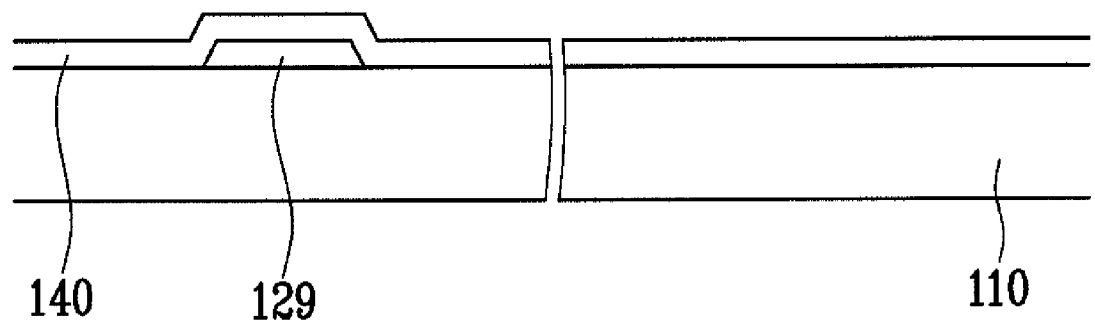

FIG. 6, FIG. 11, FIG. 14, and FIG. 17 are cross-sectional views sequentially illustrating a manufacturing process of the TFT array panel according to the exemplary embodiment of the present invention, and FIG. 7 and FIG. 8 are cross-sectional views of the TFT of FIG. 6, taken along lines VII-VII and VIII-VIII, respectively. FIG. 9 and FIG. 10 are cross-sectional views respectively illustrating the TFT array panel of FIG. 7 and FIG. 8 in the next stage of the manufacturing process, FIG. 12 and FIG. 13 are cross-sectional views respectively illustrating the TFT array panel of FIG. 11, taken along lines XII-XII and XIII-XIII, FIG. 15 and FIG. 16 are cross-sectional views respectively illustrating of the TFT array panel of FIG. 14, taken along lines XV-XV and XVI-XVI, and FIG. 18 and FIG. 19 are cross-sectional views respectively illustrating the TFT array panel of FIG. 17, taken along lines XVIII-XVIII and XIX-XIX.

Referring to FIG. 6 to FIG. 8, on an insulation substrate 110 made of, for example, transparent glass or plastic, a plurality of gate lines 121 including gate electrodes 124 and end portions 129 and a plurality of storage electrode lines 131 including storage electrodes 133a and 133b are formed.

First, a copper (Cu) layer is deposited. At this time, a target including a copper metal is sputtered for deposition of the copper layer on the substrate.

After the copper layer is deposited, a photosensitive film is coated and then exposed and developed by using a mask, and the copper layer is dry-etched or wet-etched by using the photosensitive film as an etching mask so as to form a plurality of gate lines 121 and a plurality of storage electrode lines 131.

Next, as shown in FIG. 9 and FIG. 10, the gate insulation layer 140 is formed on the entire surface of the substrate 110 through, for example, chemical vapor deposition (CVD).

In this case, the CVD can be performed by supplying, for example, a silicon-containing gas such as silane ($SiH_4$) or a nitrogen-containing gas such as nitrogen gas ($N_2$) or ammonia gas ($NH_3$) together with an inert gas, at a deposition temperature of about 220° C. to about 280° C. At the deposition temperature, the temperature of the substrate can be substantially increased to about 220° C. to about 250° C.

Figure 11:
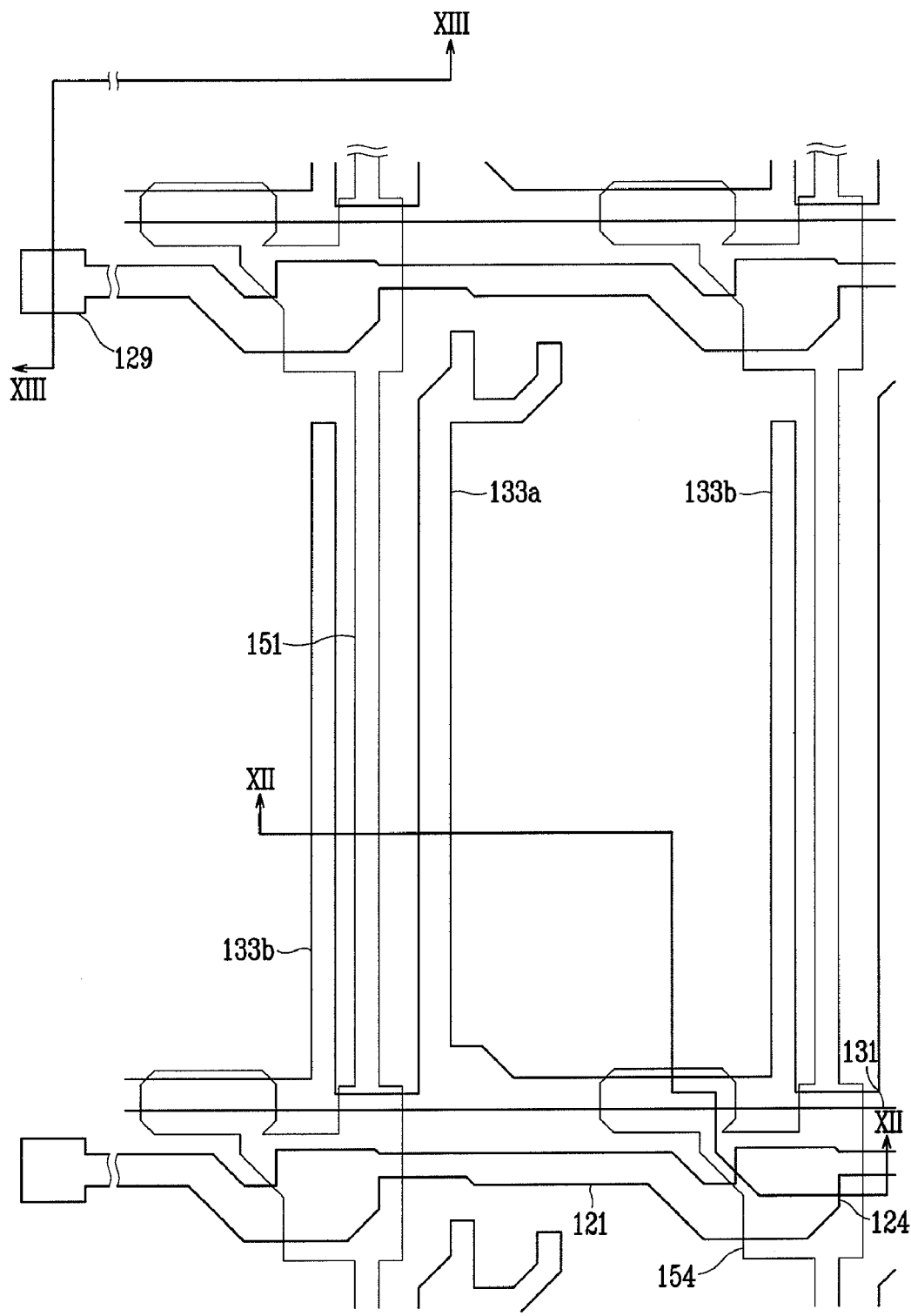
Figure 12:
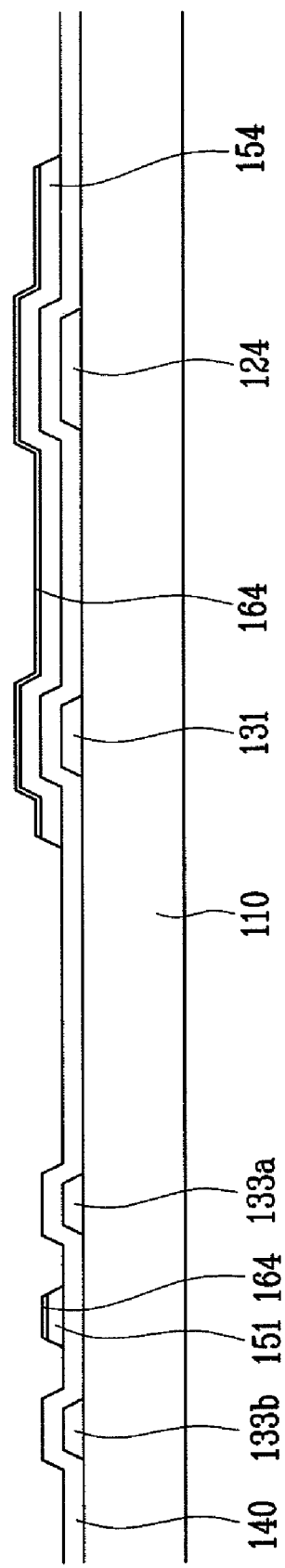
FIG. 12 and FIG. 13 are cross-sectional views respectively illustrating the TFT array panel of FIG. 11, taken along lines XII-XII and XIII-XIII.
Figure 13:
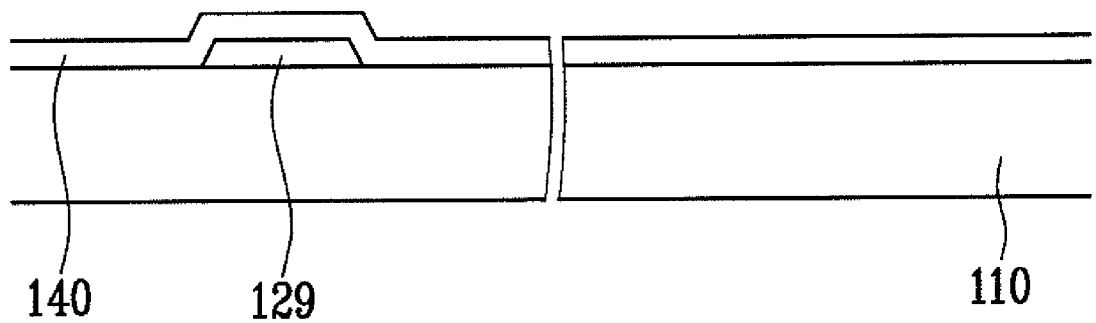

Subsequently, as shown in FIG. 11 to FIG. 13, a semiconductor layer is stacked and patterned through a photolithography process such that an intrinsic semiconductor 151 including a projection 154 and a plurality of impurity semiconductor patterns 164 are formed.

A data metal layer made of, for example, copper or a copper alloy is stacked on the impurity semiconductor patterns 164 by using, for example, a sputtering method.

Figure 14:
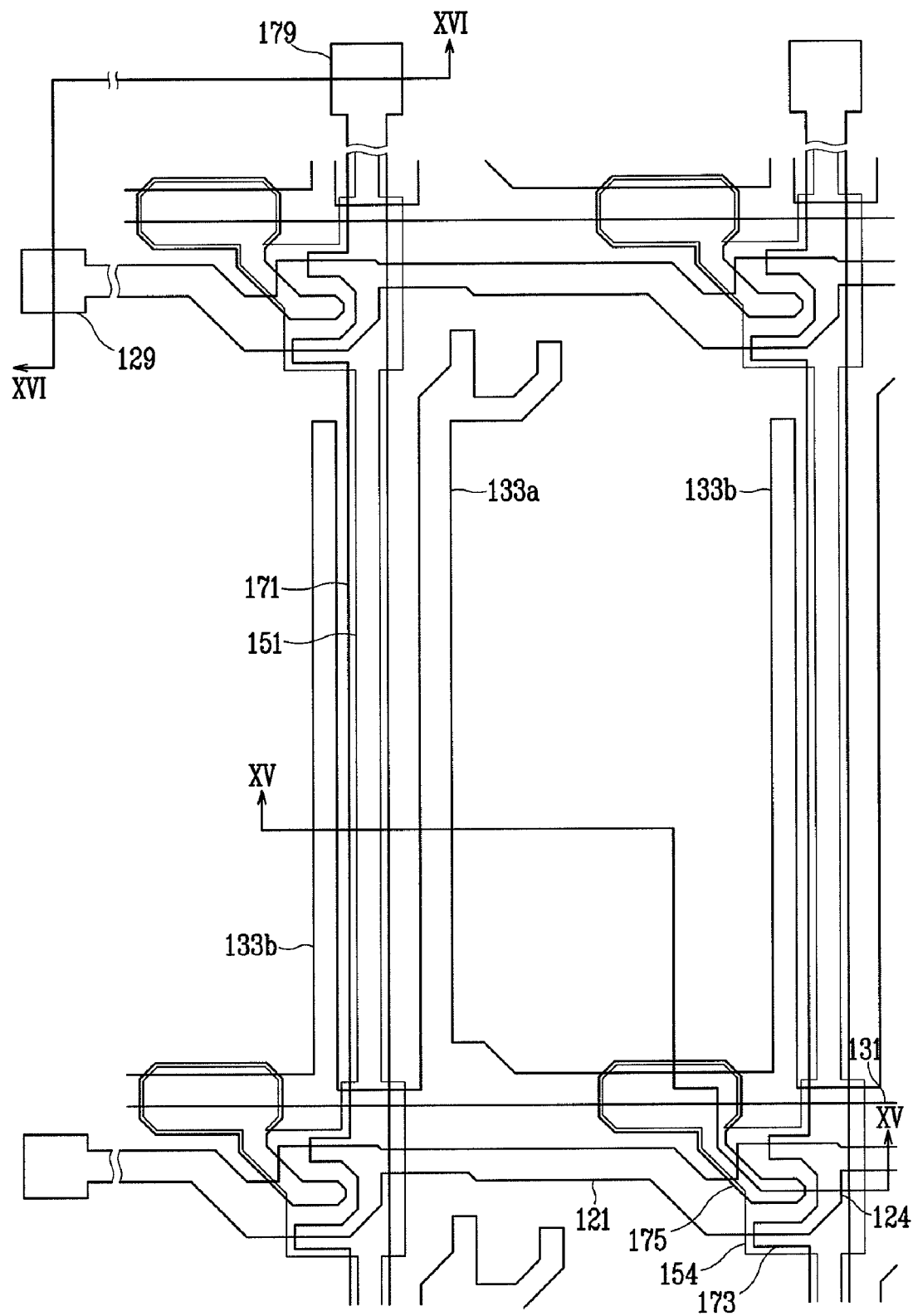
Figure 15:
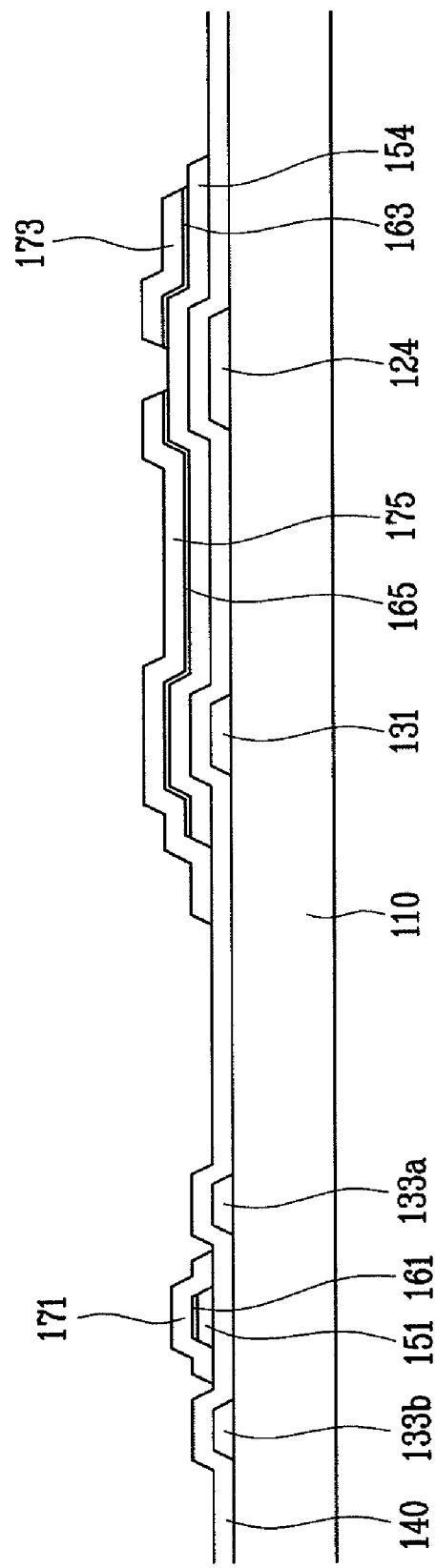
FIG. 15 and FIG. 16 are cross-sectional views respectively illustrating of the TFT array panel of FIG. 14, taken along lines XV-XV and XVI-XVI.
Figure 16:
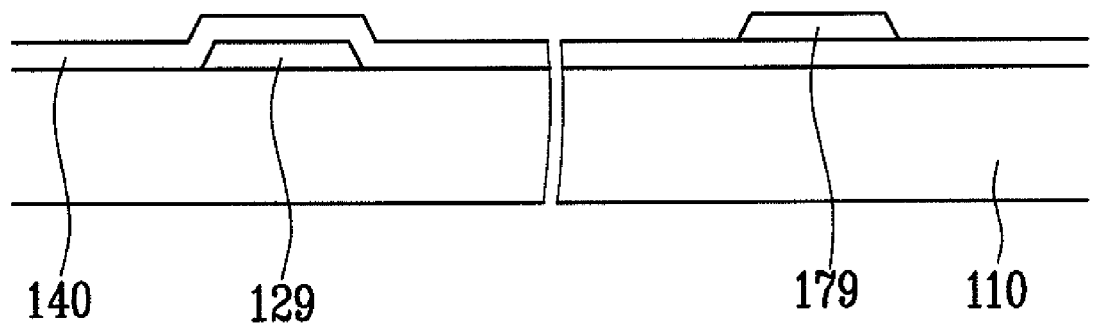

Referring to FIG. 14 to FIG. 16, the stacked data metal layer is patterned through the photolithography process so as to form a plurality of data lines 171 including source electrodes 173 and an end portion 179 and a plurality of drain electrodes 175.

Subsequently, portions of the impurity semiconductor patterns 164 that are exposed without being covered by the data lines 171 and the drain electrodes 175 are removed so as to form a plurality of ohmic contact stripes 161 including projections 163 and a plurality of ohmic contact islands 165, and portions of the underlying intrinsic semiconductors 154 are exposed.

Figure 17:
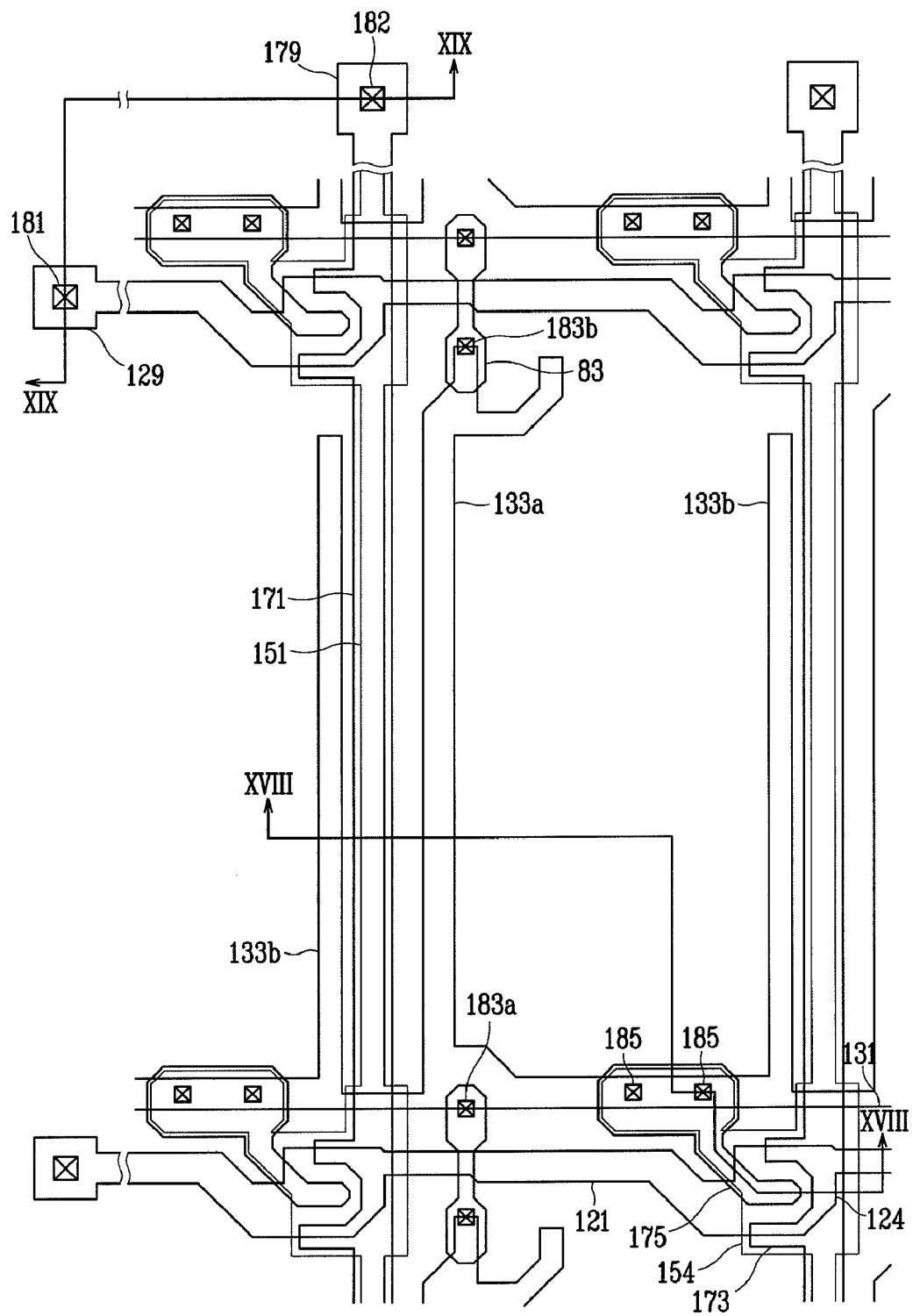
Figure 18:
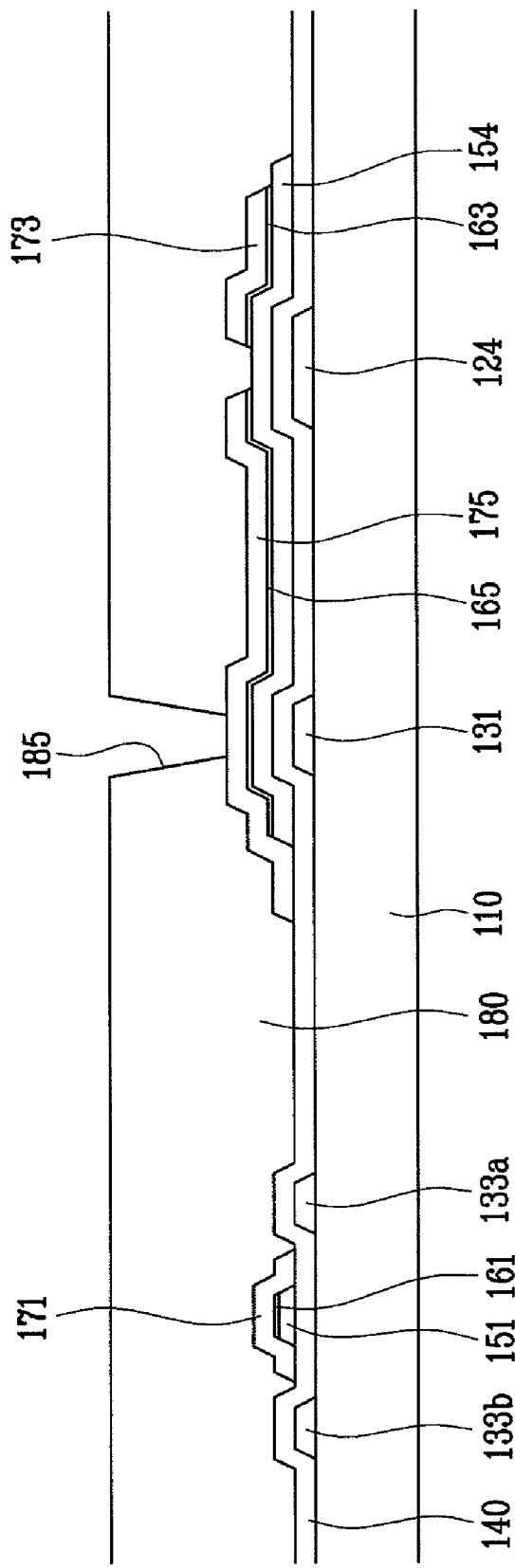
FIG. 18 and FIG. 19 are cross-sectional views respectively illustrating the TFT array panel of FIG. 17, taken along lines XVIII-XVIII and XIX-XIX.
Figure 19:
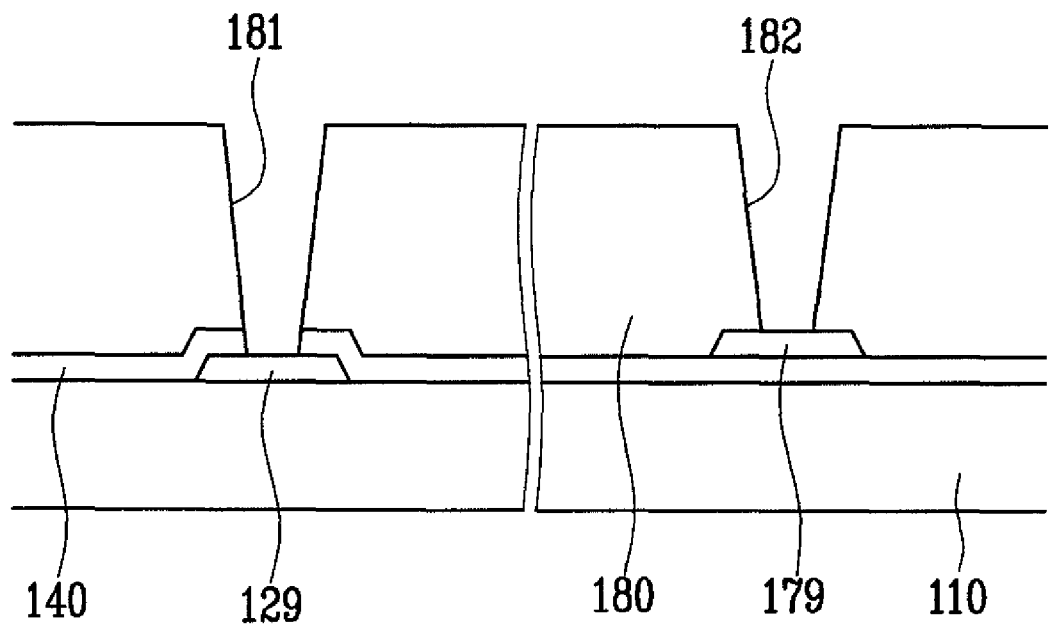

As shown in FIG. 17 to FIG. 19, a passivation layer 180 made of, for example, silicon nitride is formed and patterned together with the gate insulation layer 140 so that a plurality of contact holes 181, 182, 183a, 183b, and 185 respectively exposing the end portion 129 of the gate line 121, the end portion 179 of the data line 171, a portion of the storage electrode 131 near a fixed end of a first storage electrode 133a, a portion of projections of a free end of the first storage electrode 133a, and the drain electrode 175 are formed. In this case, like the gate insulation layer 140, the passivation layer 180 can be formed through the CVD at about 220° C. to about 280° C. by supplying, for example, a silicon-containing gas or a nitrogen-containing gas.

Subsequently, as shown in FIG. 3 to FIG. 5, a plurality of pixel electrodes 191, a plurality of contact assistants 81 and 92, and a plurality of overpasses 83 are formed on the passivation layer 180.

Exemplary Embodiment 2

A method for controlling resistance of a copper line by changing deposition conditions when an insulation layer is deposited on an upper portion of the copper line will be described in further detail.

While maintaining the deposition temperature at a constant level, the amount of silane gas (SiH4) used for the insulation layer deposition is reduced and the density of a silicon nitride ($SiN_x$) layer formed on the copper line is increased so as to prevent copper-silicide (Cu-silicide) from being formed and to reduce resistance of the copper line.

This is because an atomic ratio of [N]/[Si] within a deposited layer is increased when the amount of the silane ($SiH_4$) gas is reduced and the flow amount of a nitrogen-containing gas such as, for example, nitrogen gas $N_2$ or ammonia gas ($NH_3$) is increased during the insulation layer deposition. That is, a N-rich $SiN_x$ thin film is formed. The N-rich $SiN_x$ thin film has a high density and has few detects, and therefore silicon (Si) in the silicon nitride ($SiN_x$) layer can be prevented from passing through the silicon nitride ($SiN_x$) layer and being diffused inside the copper line.

Figure 20:
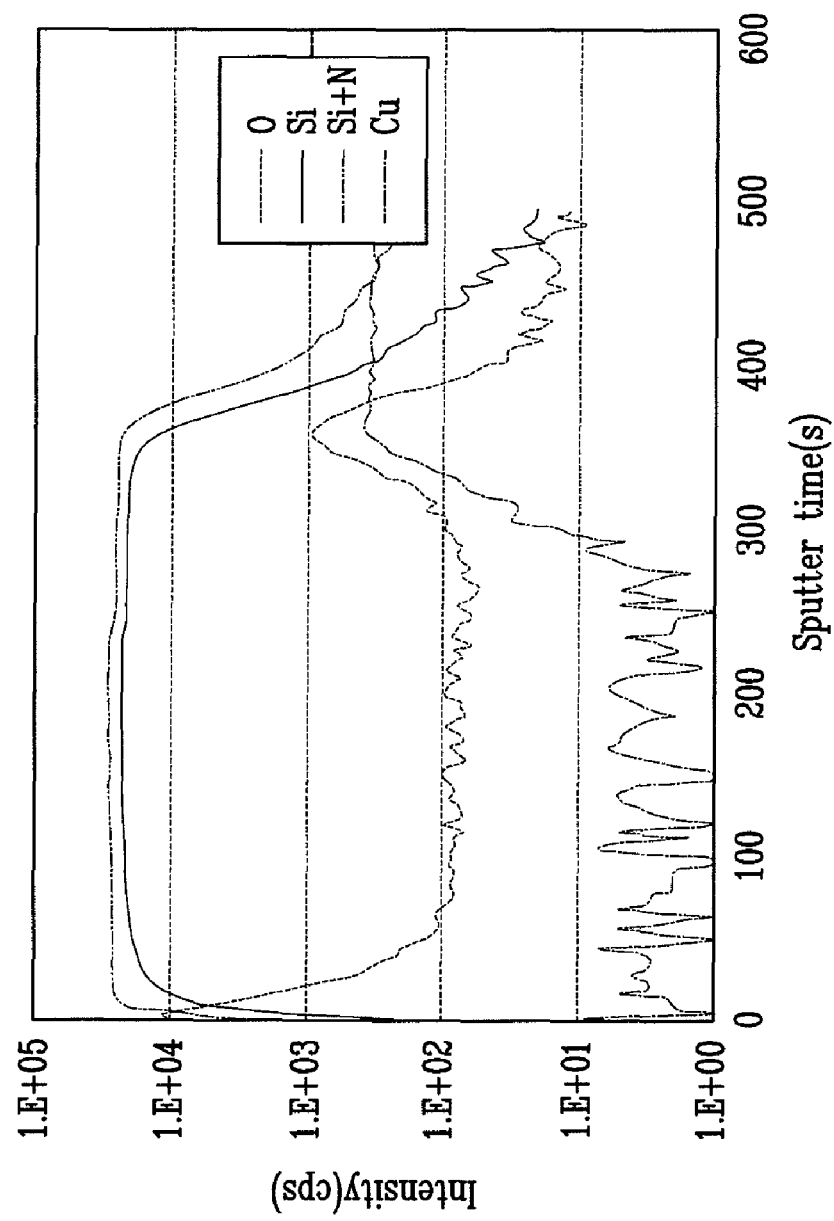
FIG. 20 and FIG. 21 are graphs showing component analysis results in a case in which a N-rich silicon nitride ($SiN_x$) thin film is deposited on an exposed copper line and a case in which a typical silicon nitride ($SiN_x$) layer is deposited.
Figure 21:
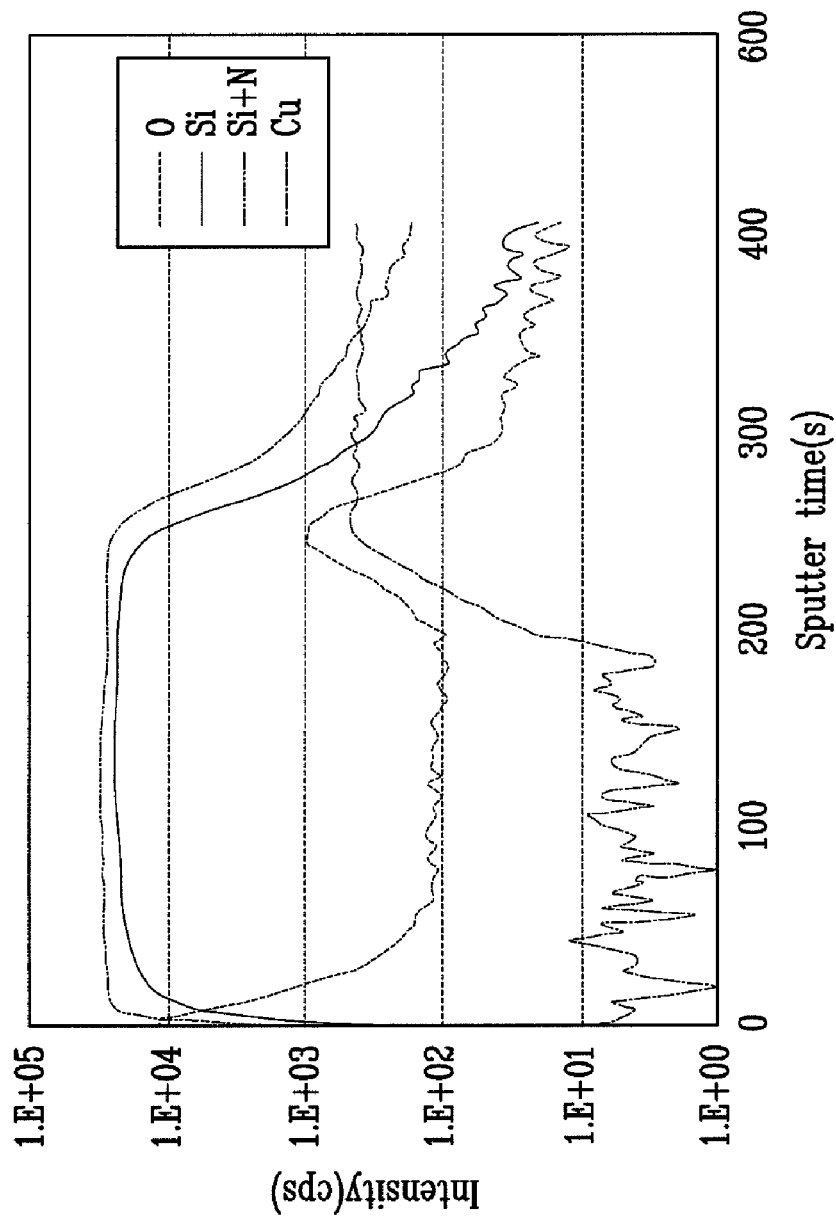

FIG. 20 and FIG. 21 respectively show a SIMS interface analysis result of a case in which an N-rich $SiN_x$ thin film is deposited on an exposed copper line and of a case in which a typical silicon nitride ($SiN_x$) layer is deposited on the exposed copper line.

As shown in FIG. 20 and FIG. 21, when the N-rich $SiN_x$ layer is deposited, a diffusion distance of the silicon (Si) inside the copper line is shorter than when the typical silicon nitride ($SiN_x$) layer is deposited. That is, when the high-density N-rich $SiN_x$ thin film is deposited, the deposited silicon nitride ($SiN_x$) layer acts as a diffusion barrier for silicon (Si) more effectively than when the typical silicon nitride ($SiN_x$) layer is deposited.

Table 4 compares an FT-IR analysis result of the high-density N-rich silicon nitride ($SiN_x$) thin film and the typical silicon nitride ($SiN_x$) layer.

TABLE 4

|  | [N—H] | [Si—H] | [N—H]/[Si—H] |
|---|---|---|---|
| Typical $SiN_x$ layer | 1.5E+22~2.0E+22 | 50E+22~8.0E−21 | 1.5~2.5 |
| High-density N-rich $SiN_x$ thin film | 2.5E+22~4.0E+22 | 10E+22~2.0E−21 | 20~40 |

As shown in Table 4, [N—H] binding numbers of the high-density N-rich silicon nitride ($SiN_x$) thin film are higher than those of the typical silicon nitride ($SiN_x$) layer and [Si—H] binding numbers of the high-density N-rich silicon nitride ($SiN_x$) thin film are lower than those of the typical silicon nitride ($SiN_x$) layer so that a ratio of the [N—H]/[Si—H] combining number of the high-density N-rich silicon nitride ($SiN_x$) thin film is significantly high. That is, the ratio of the [N—H]/[Si—H] binding number of the high-density N-rich silicon nitride ($SiN_x$) thin film is about 10 times higher than a ratio of the [N—H]/[Si—H] binding number of the typical silicon nitride ($SiN_x$) layer.

As described, a high ratio of the [N—H]/[Si—H] binding number implies that the amount of nitrogen (N) is relatively high, and accordingly a high-density silicon nitride ($SiN_x$) layer is formed.

Therefore, a high-density N-rich silicon nitride ($SiN_x$) layer can be formed by controlling the ratio of the [N—H]/[Si—H] binding number.

However, the typical silicon nitride ($SiN_x$) layer has a high deposition speed of more than about 20 angstroms (Å)/sec, whereas the high-density N-rich silicon nitride ($SiN_x$) layer has a deposition speed of less than about 15 Å/sec. Therefore, the manufacturing time may be significantly increased.

Thus, a thin high-density silicon nitride ($SiN_x$) layer is deposited on the substrate and then a typical silicon nitride ($SiN_x$) having a high deposition speed is sequentially deposited.

At this time, the thickness of the high-density N-rich silicon nitride ($SiN_x$) layer should be controlled to be greater than a predetermined thickness. As the thickness of the high-density N-rich silicon nitride ($SiN_x$) layer increases, the manufacturing time increases, thereby decreasing productivity. However, when the high-density N-rich silicon nitride ($SiN_x$) layer is too thin, it may not effectively act as a diffusion barrier so that silicon (Si) may be diffused and react with copper.

In the present exemplary embodiment of the present invention, the thickness of the N-rich silicon nitride ($SiN_x$) is about 50 to about 600 Å, and preferably about 400 to about 600 Å.

Table 5 shows resistance variation of gate wiring and characteristic variation of a thin film transistor (TFT) in which gate wiring is formed by using copper and a high-density N-rich silicon nitride ($SiN_x$) layer deposited on the gate wiring at about 500 Å, and then a gate insulation layer is formed by depositing a typical silicon nitride ($SiN_x$) layer, thereby forming a TFT.

TABLE 5

| DeletedTextsDeletedTexts | | | | | | | |
|---|---|---|---|---|---|---|---|
| CVD deposition condition | Glass No. | Cu line resistance Ω η | Resistance Ω η after forming insulation layer | Resistance Ω η after annealing | On-current A(E = 06) | Off-current A(E−13) | On/Off ratio (E+07) |
| Deposition of typical $SiN_x$ layer | 1 | 2.35 | 3.13 | 3.13 | 7.09 | 4.36 | 1.63 |
|  | 2 | 2.35 | 2.78 | 2.82 | 7.37 | 5.84 | 1.26 |
|  | 3 | 2.37 | 2.75 | 3.10 | 7.77 | 6.29 | 1.24 |
|  | 4 | 2.34 | 2.89 | 3.11 | 7.83 | 6.65 | 1.18 |
|  | 5 | 2.37 | 3.10 | 3.12 | 7.69 | 6.43 | 1.20 |
|  | 6 | 2.34 | 2.92 | 3.11 | 7.50 | 9.22 | 8.13 |
| Deposition of typical $SiN_x$ layer after | 1 | 2.36 | 2.59 | 2.57 | 8.68 | 7.47 | 1.16 |
|  | 2 | 2.35 | 2.62 | 2.61 | 8.55 | 7.28 | 1.17 |
|  | 3 | 2.38 | 2.46 | 2.45 | 9.37 | 7.58 | 1.24 |

TABLE 5-continued

DeletedTextsDeletedTexts

| CVD deposition condition | Glass No. | Cu line resistance Ω η | Resistance Ω η after forming insulation layer | Resistance Ω η after annealing | On-current A(E = 06) | Off-current A(E−13) | On/Off ratio (E+07) |
|---|---|---|---|---|---|---|---|
| deposition of N-rich $SiN_x$ layer at 500 Å | 4 | 2.32 | 2.38 | 2.38 | 9.03 | 8.42 | 1.07 |
| | 5 | 2.35 | 2.55 | 2.54 | 8.23 | 9.78 | 8.42 |
| | 6 | 2.34 | 2.60 | 2.60 | 8.77 | 8.78 | 9.99 |

As shown in Table 5, when the typical silicon nitride ($SiN_x$) layer is deposited after the high-density N-rich silicon nitride ($SiN_x$) layer is deposited about 500 Å, the resistance of the copper line is more significantly reduced then when only the typical silicon nitride ($SiN_x$) layer is deposited. In this case, characteristics of the transistor are not changed.

A layout view of the TFT array panel formed by using an insulation layer having a typical silicon nitride layer formed on a N-rich silicon nitride layer as the gate insulation layer is as shown in FIG. 3, and a cross-sectional view of the TFT array panel of FIG. 3 is the same as FIG. 4 and FIG. 5.

However, the gate insulation layer 140 formed on the gate lines 121 and the storage electrode lines 131 is formed by depositing the typical silicon nitride ($SiN_x$) layer after forming the N-rich silicon nitride ($SiN_x$) layer having a high density of about 500 Å. In addition, after sequentially forming the high-density N-rich silicon nitride ($SiN_x$) layer and the typical silicon nitride ($SiN_x$) layer, the high-density N-rich silicon nitride ($SiN_x$) layer may be further formed thereon. The latter N-rich silicon nitride ($SiN_x$) layer may make charges readily move at an interface portion with the intrinsic semiconductor 151, thereby improving characteristics of the TFT.

Although the above description of an embodiment of the present invention is limited to the case of the gate lines 121 made of copper and the gate insulation layer 140 made of silicon nitride, the exemplary embodiments of the present invention are not limited thereto. For example, application of the spirit of the exemplary embodiments of the present invention to the case of data lines 171 made of copper and a passivation layer 180 made of silicon nitride is also possible. In this case, an N-rich silicon nitride layer may be deposited on a passivation layer 180 near the data line 171 and a typical silicon nitride layer may be deposited thereon.

In addition, although the wiring is made of copper in the above description, the wiring may be made of any metal that can be combined with silicon and form silicide.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:
1. A thin film transistor array panel comprising:
a gate electrode including a metal that can be combined with silicon to form silicide;
a semiconductor formed under or over the gate electrode;
a gate insulation layer formed between the gate electrode and the semiconductor;
a source electrode and a drain electrode that contact the semiconductor; and
a pixel electrode connected to the drain electrode,
wherein the gate insulation layer includes a first silicon nitride layer and a second silicon nitride layer interposed between the first silicon nitride layer and the semiconductor, and
wherein a [N—H]/[Si—H] binding number ratio of the first silicon nitride layer is greater than that of the second silicon nitride layer.

2. The thin film transistor array panel of claim 1, wherein the gate line comprises copper.

3. The thin film transistor array panel of claim 2, wherein the first silicon nitride layer has a thickness of about 50 to about 600 angstroms (Å).

4. The thin film transistor array panel of claim 2, wherein the [N—H]/[Si—H] binding number ratio of the first silicon nitride layer is about 20 to about 40, and the [N—H]/[Si—H] binding number ratio of the second silicon nitride layer is about 1.5 to about 2.5.

5. The thin film transistor array panel of claim 1, further comprising a passivation layer formed on the source electrode and the drain electrode,
wherein the passivation layer includes a third silicon nitride layer and a fourth silicon nitride layer interposed between the third silicon nitride layer and the pixel electrode, and a [N—H]/[Si—H] binding number ratio of the third silicon nitride is greater than that of the fourth silicon nitride.

6. A thin film transistor array panel comprising:
a gate electrode including a metal that can be combined with silicon to form silicide;
a semiconductor formed under or over the gate electrode;
a gate insulation layer interposed between the gate electrode and the semiconductor, wherein the gate insulation layer comprises silicon nitride;
a source electrode and a drain electrode that contact the semiconductor; and
a pixel electrode connected to the drain electrode,
wherein the gate insulation layer comprises a contact unit that contacts the gate electrode, a channel unit that contacts the semiconductor, and a middle unit interposed between the contact unit and the channel unit, and
wherein the contact unit and the middle unit have different [N—H]/[Si—H] binding number ratios.

7. The thin film transistor array panel of claim 6, wherein the gate electrode comprises copper.

8. The thin film transistor array panel of claim 7, wherein the [N—H]/[Si—H] binding number ratio of the contact unit of the gate insulation layer is greater than that of the middle unit.

9. The thin film transistor array panel of claim 8, wherein the [N—H]/[Si—H] binding number ratio of the contact unit is about 20 to about 40, and the [N—H]/[Si—H] binding number ratio of the middle unit is about 1.5 to about 2.5.

10. The thin film transistor array panel of claim 6, wherein the [N—H]/[Si—H] binding number ratios of the contact unit and the channel unit are greater than that of the middle unit.

11. The thin film transistor array panel of claim 10, wherein the [N—H]/[Si—H] binding number ratios of the contact unit and the channel unit are about 20 to about 40, and the [N—H]/[Si—H] binding number ratio of the middle unit is about 1.5 to about 2.5.

* * * * *